United States Patent
Fujiwara et al.

(10) Patent No.: US 9,153,742 B2
(45) Date of Patent: *Oct. 6, 2015

(54) GAN-CRYSTAL FREE-STANDING SUBSTRATE AND METHOD FOR PRODUCING THE SAME

(71) Applicant: Sumitomo Electric Industries, Ltd., Osaka-shi, Osaka (JP)

(72) Inventors: Shinsuke Fujiwara, Itami (JP); Koji Uematsu, Itami (JP); Hitoshi Kasai, Itami (JP); Takuji Okahisa, Itami (JP)

(73) Assignee: SUMITOMO ELECTRIC INDUSTRIES, LTD., Osaka-shi, Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/933,514

(22) Filed: Jul. 2, 2013

(65) Prior Publication Data

US 2013/0292737 A1 Nov. 7, 2013

Related U.S. Application Data

(63) Continuation of application No. 13/235,989, filed on Sep. 19, 2011, now Pat. No. 8,574,364, which is a continuation of application No. PCT/JP2011/062106, filed on May 26, 2011.

(30) Foreign Application Priority Data

Jun. 10, 2010 (JP) ................. 2010-132623

(51) Int. Cl.
| | | |
|---|---|---|
| H01L 33/32 | (2010.01) | |
| H01L 21/02 | (2006.01) | |
| C30B 29/40 | (2006.01) | |
| C30B 25/02 | (2006.01) | |

(52) U.S. Cl.
CPC .............. *H01L 33/325* (2013.01); *C30B 25/02* (2013.01); *C30B 29/406* (2013.01); *H01L 21/0237* (2013.01); *H01L 21/0254* (2013.01); *H01L 21/02389* (2013.01); *H01L 21/02576* (2013.01); *H01L 21/02609* (2013.01); *H01L 21/02664* (2013.01)

(58) Field of Classification Search
None
See application file for complete search history.

(56) References Cited

U.S. PATENT DOCUMENTS

| 7,794,541 B2 | 9/2010 | Shibata et al. | |
|---|---|---|---|
| 2009/0081110 A1* | 3/2009 | Shibata et al. | 423/409 |
| 2009/0155989 A1 | 6/2009 | Uematsu et al. | |
| 2010/0322841 A1* | 12/2010 | Okahisa et al. | 423/409 |
| 2011/0001142 A1* | 1/2011 | Saitoh | 257/76 |

FOREIGN PATENT DOCUMENTS

| JP | 11-001396 | 1/1999 |
|---|---|---|
| JP | 2000-049374 A | 2/2000 |
| JP | 2001-102307 A | 4/2001 |
| JP | 2006-265101 A | 10/2006 |
| JP | 2007-126320 A | 5/2007 |
| JP | 2007-197302 A | 8/2007 |
| JP | 2009-126721 A | 6/2009 |
| JP | 2009-173507 A | 8/2009 |
| JP | 2009-269816 A | 11/2009 |

OTHER PUBLICATIONS

Slack et al.; Some Effects of oxygen impurities on AlN and GaN; Journal of Crystal Growth; 246, pp. 287-298; 2002.*
Merriam Webster; definition of plane; Feb. 22, 2015.*
K. Moteki, "Development of GaN Substrates", SEI Technical Review, No. 175, pp. 10-18, Jul. 2009, with English abstract.
Notification of Reasons for Rejection issued Oct. 28, 2014 in corresponding Japanese Patent Application No. 2010-132623 (2 pages) with partial English Translation (2 pages).

* cited by examiner

*Primary Examiner* — Guinever S Gregorio
(74) *Attorney, Agent, or Firm* — Drinker Biddle & Reath LLP

(57) ABSTRACT

A GaN-crystal free-standing substrate obtained from a GaN crystal grown by HVPE with a (0001) plane serving as a crystal growth plane and at least one plane of a {10-11} plane and a {11-22} plane serving as a crystal growth plane that constitutes a facet crystal region, except for the side surface of the crystal, wherein the (0001)-plane-growth crystal region has a carbon concentration of $5 \times 10^{16}$ atoms/cm$^3$ or less, a silicon concentration of $5 \times 10^{17}$ atoms/cm$^3$ or more and $2 \times 10^{18}$ atoms/cm$^3$ or less, and an oxygen concentration of $1 \times 10^{17}$ atoms/cm$^3$ or less; and the facet crystal region has a carbon concentration of $3 \times 10^{16}$ atoms/cm$^3$ or less, a silicon concentration of $5 \times 10^{17}$ atoms/cm$^3$ or less, and an oxygen concentration of $5 \times 10^{17}$ atoms/cm$^3$ or more and $5 \times 10^{18}$ atoms/cm$^3$ or less.

4 Claims, No Drawings

GAN-CRYSTAL FREE-STANDING SUBSTRATE AND METHOD FOR PRODUCING THE SAME

CROSS REFERENCE TO RELATED APPLICATIONS

This application is a continuation of U.S. patent application Ser. No. 13/235,989, filed Sep. 19, 2011 which is a continuation of International Application No. PCT/JP2011/062106, filed on May 26, 2011 which claims the benefit of Japanese application No. 2010-132623, filed on Jun. 10, 2010, each of which is hereby incorporated by reference in their entirety.

BACKGROUND OF THE INVENTION

1. Field of the Invention

The present invention relates to a GaN-crystal free-standing substrate suitable for fabrication of a light-emitting device having high color purity; and a method for producing the GaN-crystal free-standing substrate.

2. Description of the Related Art

Substrates used for light-emitting devices are required to have individual characteristics depending on the types of light-emitting devices. For example, Japanese Unexamined Patent Application Publication No. 2000-049374 discloses that, to provide white-light emission by deliberately using light emission (hereafter, referred to as yellow-light emission) having a broad peak wavelength range including 550 nm and wavelengths around 550 nm from a substrate, a substrate that provides high-intensity yellow-light emission is used. The presence of yellow-light emission in light-emitting devices that provide monocolor light emission degrades the color purity of the light emission. To suppress such degradation, Japanese Unexamined Patent Application Publication No. 11-1396 discloses a GaN substrate having been made to have a high purity. Japanese Unexamined Patent Application Publication No. 2007-126320 discloses a GaN substrate having a low absorptivity and electrical conductivity.

SUMMARY OF THE INVENTION

Technical Problem

However, when a substrate is made to have a high purity, the electrical conductivity of the substrate decreases. Accordingly, such a substrate is not suitable for light-emitting devices. When a GaN substrate is doped with an impurity contributing to electrical conductivity in an appropriate amount, the resultant GaN substrate has a low absorptivity, causes less yellow-light emission, and has electrical conductivity. However, in GaN crystal growth by hydride vapor phase epitaxy (HVPE), even when the growth is initiated with the (0001) plane serving as the main crystal growth plane, as the growth proceeds, the (0001) plane, the {10-11} plane, and the {11-22} plane come to be present as the crystal growth planes. Thus, less yellow-light emission and electrical conductivity have not been achieved over the entirety of the crystal growth planes.

Accordingly, an object of the present invention is to provide a GaN-crystal free-standing substrate that is formed by processing a GaN crystal grown by HVPE with the (0001) plane serving as a crystal growth plane and at least one plane of a {10-11} plane and a {11-22} plane serving as a crystal growth plane, and that causes less yellow-light emission and has electrical conductivity over the entire surface of the substrate; and a method for producing the GaN-crystal free-standing substrate.

Solution to Problem

The present invention provides a GaN-crystal free-standing substrate that is formed by processing a GaN crystal grown by HVPE with a (0001) plane serving as a crystal growth plane and at least one plane of a {10-11} plane and a {11-22} plane serving as a crystal growth plane, except for a side surface of the crystal, wherein, in the GaN-crystal free-standing substrate, a first crystal region grown with the (0001) plane serving as the crystal growth plane has a carbon concentration of $5\times10^{16}$ atoms/cm$^3$ or less, a silicon concentration of $5\times10^{17}$ atoms/cm$^3$ or more and $2\times10^{18}$ atoms/cm$^3$ or less, and an oxygen concentration of $1\times10^{17}$ atoms/cm$^3$ or less; and a second crystal region grown with the at least one plane of the {10-11} plane and the {11-22} plane serving as the crystal growth plane has a carbon concentration of $3\times10^{16}$ atoms/cm$^3$ or less, a silicon concentration of $5\times10^{17}$ atoms/cm$^3$ or less, and an oxygen concentration of $5\times10^{17}$ atoms/cm$^3$ or more and $5\times10^{18}$ atoms/cm$^3$ or less.

In a GaN-crystal free-standing substrate according to the present invention, the first crystal region may have a carbon concentration of $3\times10^{16}$ atoms/cm$^3$ or less, a silicon concentration of $5\times10^{17}$ atoms/cm$^3$ or more and $1\times10^{18}$ atoms/cm$^3$ or less, and an oxygen concentration of $1\times10^{17}$ atoms/cm$^3$ or less; and the second crystal region may have a carbon concentration of $2\times10^{16}$ atoms/cm$^3$ or less, a silicon concentration of $5\times10^{17}$ atoms/cm$^3$ or less, and an oxygen concentration of $5\times10^{17}$ atoms/cm$^3$ or more and $2\times10^{18}$ atoms/cm$^3$ or less.

The present invention also provides a method for producing a GaN-crystal free-standing substrate, the method including a step of growing a GaN crystal by HVPE with a (0001) plane serving as a crystal growth plane and at least one plane of a {10-11} plane and a {11-22} plane serving as a crystal growth plane, except for a side surface of the crystal; and a step of forming a GaN-crystal free-standing substrate by processing the GaN crystal, wherein, in the GaN-crystal free-standing substrate, a first crystal region grown with the (0001) plane serving as the crystal growth plane has a carbon concentration of $5\times10^{16}$ atoms/cm$^3$ or less, a silicon concentration of $5\times10^{17}$ atoms/cm$^3$ or more and $2\times10^{18}$ atoms/cm$^3$ or less, and an oxygen concentration of $1\times10^{17}$ atoms/cm$^3$ or less; and a second crystal region grown with the at least one plane of the {10-11} plane and the {11-22} plane serving as the crystal growth plane has a carbon concentration of $3\times10^{16}$ atoms/cm$^3$ or less, a silicon concentration of $5\times10^{17}$ atoms/cm$^3$ or less, and an oxygen concentration of $5\times10^{17}$ atoms/cm$^3$ or more and $5\times10^{18}$ atoms/cm$^3$ or less.

In a method for producing a GaN-crystal free-standing substrate according to the present invention, in the GaN-crystal free-standing substrate, the first crystal region may have a carbon concentration of $3\times10^{16}$ atoms/cm$^3$ or less, a silicon concentration of $5\times10^{17}$ atoms/cm$^3$ or more and $1\times10^{18}$ atoms/cm$^3$ or less, and an oxygen concentration of $1\times10^{17}$ atoms/cm$^3$ or less; and the second crystal region may have a carbon concentration of $2\times10^{16}$ atoms/cm$^3$ or less, a silicon concentration of $5\times10^{17}$ atoms/cm$^3$ or less, and an oxygen concentration of $5\times10^{17}$ atoms/cm$^3$ or more and $2\times10^{18}$ atoms/cm$^3$ or less.

Advantageous Effects of Invention

The present invention can provide a GaN-crystal free-standing substrate that is suitable for fabrication of a light-emitting device having high color purity and that causes less yellow-light emission and has electrical conductivity over the entire surface of the substrate; and a method for producing the GaN-crystal free-standing substrate.

DETAILED DESCRIPTION OF THE INVENTION

First Embodiment

A GaN-crystal free-standing substrate according to an embodiment of the present invention is a GaN-crystal free-standing substrate that is formed by processing a GaN crystal grown by HVPE with a (0001) plane serving as a crystal growth plane and at least one plane (hereafter, also referred to as a facet) of a {10-11} plane and a {11-22} plane serving as a crystal growth plane, except for the side surface of the crystal. In the GaN-crystal free-standing substrate, a first crystal region (hereafter, also referred to as a (0001)-plane-growth crystal region) grown with the (0001) plane serving as the crystal growth plane has a carbon concentration of $5\times10^{16}$ atoms/cm$^3$ or less, a silicon concentration of $5\times10^{17}$ atoms/cm$^3$ or more and $2\times10^{18}$ atoms/cm$^3$ or less, and an oxygen concentration of $1\times10^{17}$ atoms/cm$^3$ or less; and a second crystal region (hereafter, also referred to as a facet-growth crystal region) grown with the at least one plane of the {10-11} plane and the {11-22} plane serving as the crystal growth plane has a carbon concentration of $3\times10^{16}$ atoms/cm$^3$ or less, a silicon concentration of $5\times10^{17}$ atoms/cm$^3$ or less, and an oxygen concentration of $5\times10^{17}$ atoms/cm$^3$ or more and $5\times10^{18}$ atoms/cm$^3$ or less.

In a GaN-crystal free-standing substrate according to the first embodiment, the (0001)-plane-growth crystal region (first crystal region) and the facet-growth crystal region (second crystal region) have carbon concentrations, silicon concentrations, and oxygen concentrations in the predetermined ranges. Accordingly, the GaN-crystal free-standing substrate causes less yellow-light emission and has electrical conductivity.

In view of such respects, in a GaN-crystal free-standing substrate according to the first embodiment, the (0001)-plane-growth crystal region (first crystal region) preferably has a carbon concentration of $3\times10^{16}$ atoms/cm$^3$ or less, a silicon concentration of $5\times10^{17}$ atoms/cm$^3$ or more and $1\times10^{18}$ atoms/cm$^3$ or less, and an oxygen concentration of $1\times10^{17}$ atoms/cm$^3$ or less; and the facet-growth crystal region (second crystal region) preferably has a carbon concentration of $2\times10^{16}$ atoms/cm$^3$ or less, a silicon concentration of $5\times10^{17}$ atoms/cm$^3$ or less, and an oxygen concentration of $5\times10^{17}$ atoms/cm$^3$ or more and $2\times10^{18}$ atoms/cm$^3$ or less.

The (0001)-plane-growth crystal region (first crystal region) and the facet-growth crystal region (second crystal region) of a GaN-crystal free-standing substrate are observed with a fluorescent microscope. The carbon concentrations, silicon concentrations, and oxygen concentrations of a GaN-crystal free-standing substrate are measured by secondary ion mass spectrometry (SIMS). The crystal planes (for example, the (0001) plane, the {10-11} plane, and the {11-22} plane) of a GaN-crystal free-standing substrate are determined by X-ray diffractometry.

As for a GaN-crystal free-standing substrate according to the first embodiment, a method for growing a GaN crystal by HVPE with the (0001) plane serving as a crystal growth plane and at least one plane (facet) of the {10-11} plane and the {11-22} plane serving as a crystal growth plane, except for the side surface of the crystal, and a method for forming the GaN-crystal free-standing substrate by processing such a GaN crystal will be described in a method for producing a GaN-crystal free-standing substrate according to a second embodiment below.

In a GaN-crystal free-standing substrate according to the first embodiment, the average density of dislocations extending through the main surfaces of the substrate (hereafter, referred to as an average dislocation density) is preferably $3\times10^6$ cm$^{-2}$ or less. The lower the average dislocation density, the more reliable the resultant light-emitting device becomes. In view of such a respect, the average dislocation density is more preferably $1\times10^6$ cm$^{-2}$ or less. In view of the current techniques for producing a GaN-crystal free-standing substrate, it is difficult to achieve an average dislocation density of less than $1\times10^4$ cm$^{-2}$ at present. Accordingly, the average dislocation density becomes about $1\times10^4$ cm$^{-2}$ or more. The average dislocation density of a GaN-crystal free-standing substrate is measured by a cathodoluminescence (CL) method.

A GaN-crystal free-standing substrate according to the first embodiment preferably has flat main surfaces and the radius of curvature of a crystal plane that is the closest to the main surfaces is preferably 10 m or more. The larger the radius of curvature of such a crystal plane, the more uniform the light-emitting wavelength becomes within the surface of the substrate of the resultant light-emitting device. In view of such a respect, the radius of curvature of a crystal plane that is the closest to the main surfaces is more preferably 20 m or more. In view of the current techniques for producing a GaN-crystal free-standing substrate, it is difficult to make the radius of curvature of a crystal plane that is the closest to the main surfaces be more than 100 m at present. Accordingly, the radius of curvature becomes about 100 m or less. The radius of curvature of a crystal plane is measured by subjecting the crystal plane to X-ray diffractometry.

A GaN-crystal free-standing substrate according to the first embodiment preferably has high electrical conductivity over the entire surface thereof. Specifically, the substrate preferably has, over the entire surface thereof, a resistivity of 0.05 Ωcm or less, more preferably 0.02 Ωcm or less. The resistivity of a substrate is determined by Hall measurement.

Although a crystal plane that is the closest to the main surfaces of a GaN-crystal free-standing substrate according to the first embodiment is not particularly limited, in view of epitaxially growing a highly crystalline semiconductor layer on such a main surface, the crystal plane is preferably, for example, the (0001) plane, the {10-10} plane, the {11-20} plane, the {10-11} plane, the {11-22} plane, the {20-21} plane, or the {22-44} plane. In view of epitaxially growing a highly crystalline semiconductor layer on a main surface of a GaN-crystal free-standing substrate, the absolute value of an off angle of the main surface of the GaN-crystal free-standing substrate with respect to the crystal plane is preferably 5° or less. The plane orientation of a crystal plane that is the closest to a GaN substrate, and the off angle between a main surface of the GaN substrate and the crystal plane are measured by X-ray diffractometry.

In a GaN-crystal free-standing substrate according to the first embodiment, the peak intensity of yellow-light emission (light emission having a broad peak wavelength range including 550 nm and wavelengths around 550 nm) excited by light having a peak wavelength of 400 nm can be made low over the entire surface of the substrate.

Second Embodiment

A method for producing a GaN-crystal free-standing substrate according to another embodiment of the present invention includes a step of growing a GaN crystal by HVPE with a (0001) plane serving as a crystal growth plane and at least one plane (facet) of a {10-11} plane and a {11-22} plane serving as a crystal growth plane, except for the side surface of the crystal; and a step of forming a GaN-crystal free-standing substrate by processing the GaN crystal. In the GaN-crystal free-standing substrate, a first crystal region ((0001)-plane-growth crystal region) grown with the (0001) plane serving as the crystal growth plane has a carbon concentration of $5\times10^{16}$ atoms/cm$^3$ or less, a silicon concentration of $5\times10^{17}$ atoms/cm$^3$ or more and $2\times10^{18}$ atoms/cm$^3$ or less, and an oxygen concentration of $1\times10^{17}$ atoms/cm$^3$ or less; and a second crystal region (facet-growth crystal region) grown with the at least one plane (facet) of the {10-11} plane and the {11-22} plane serving as the crystal growth plane has a carbon concentration of $3\times10^{16}$ atoms/cm$^3$ or less, a silicon concentration of $5\times10^{17}$ atoms/cm$^3$ or less, and an oxygen concentration of $5\times10^{17}$ atoms/cm$^3$ or more and $5\times10^{18}$ atoms/cm$^3$ or less.

Use of a method for producing a GaN-crystal free-standing substrate according to the second embodiment efficiently provides a GaN-crystal free-standing substrate according to the first embodiment in which the (0001)-plane-growth crystal region (first crystal region) and the facet-growth crystal region (second crystal region) have carbon concentrations, silicon concentrations, and oxygen concentrations in the predetermined ranges. In a GaN-crystal free-standing substrate produced by a production method according to the second embodiment (a GaN-crystal free-standing substrate according to the first embodiment), the (0001)-plane-growth crystal region (first crystal region) and the facet-growth crystal region (second crystal region) have carbon concentrations, silicon concentrations, and oxygen concentrations in the predetermined ranges, and hence the GaN-crystal free-standing substrate causes less yellow-light emission and has electrical conductivity.

[Step of Growing GaN Crystal]

Although a step of growing a GaN crystal in a method for producing a GaN-crystal free-standing substrate according to the second embodiment is not particularly limited, the step may include, as a process of using a base substrate, a substep of providing a base substrate and a substep of growing a GaN crystal on the base substrate.

(Substep of Providing Base Substrate)

A base substrate provided in the step of providing a base substrate is not particularly limited as long as it is a substrate on which a GaN crystal can be epitaxially grown. Preferred examples of the base substrate include group III nitride base substrates such as a GaN base substrate and an AlN base substrate; a sapphire ($Al_2O_3$) base substrate; and a GaAs base substrate because of close lattice matching between such a substrate and a GaN crystal. In particular, a GaN base substrate is preferably used. Use of a GaN base substrate suppresses entry of impurities from a base substrate, which is preferable.

In view of such a respect, the cleanliness of the surfaces of a base substrate is important. In particular, since the back surface of the substrate cannot be etched in a growth furnace prior to the growth of a crystal, the cleanliness of the back surface needs to be enhanced before the substrate is placed in the growth furnace. Accordingly, a substrate is preferably placed in a growth furnace after the back surface of the substrate is etched. The etching may be performed by, for example, wet etching with an alkaline solvent or the like or dry etching with a halogen-based gas or the like.

When a plane orientation with which GaN in the (0001) plane is grown is selected as the plane orientation of the main surfaces of a base substrate, a GaN crystal excellent in crystallinity can be grown, which is preferable.

(Substep of Growing GaN Crystal on Base Substrate)

Although a process of growing a GaN crystal in the substep of growing GaN crystal on a base substrate is not particularly limited, in view of growing a GaN crystal having high crystallinity at a high rate, HVPE is preferably used.

In HVPE, since crystal growth is generally performed in a quartz reaction tube, a crystal in the quartz reaction tube is heated and hence the quartz reaction tube is also heated together with the crystal. Accordingly, decomposition gas from the quartz reaction tube heated at a high temperature is incorporated as an impurity into the crystal. For this reason, the interior of the quartz reaction tube is preferably covered with a liner tube composed of a material that is stable at the growth temperature (for example, pyrolytic boron nitride (pBN) or SiC-coated carbon (carbon covered with silicon carbide)). Gas introduction pipes disposed in the reaction tube to supply source gases to a base substrate may also be formed of quartz. Note that, since such a gas introduction pipe is heated at a high temperature in the vicinity of a base substrate, a nozzle composed of a material that is stable at the growth temperature (for example, pBN or SiC-coated carbon) is preferably attached as the tip of the gas introduction pipe, the tip being subjected to the high temperature. There are cases where carbon members that are readily made by processing are placed in the reaction tube. Such carbon members cause contamination by carbon and hence they are preferably coated with pBN, SiC, or the like. Purge gas (for example, $H_2$, $N_2$, or Ar) is preferably made to flow through the gap between the quartz reaction tube and the liner tube so that the gap is purged with the gas and impurities do not remain in the gap. A susceptor on which the base substrate is placed is also subjected to a high temperature. Accordingly, the susceptor is preferably formed of pBN or the surface of the susceptor is preferably coated with a high-purity and stable material such as pBN, AlN, $Al_2O_3$, or SiC (silicon carbide). In the above-described manner, an increase in the concentrations of carbon and oxygen by unintentional addition (accidental addition) of carbon and oxygen to a GaN crystal during the growth of the GaN crystal can be suppressed.

In the substep of growing a GaN crystal in which the GaN crystal is grown by HVPE with the (0001) plane serving as a crystal growth plane and at least one plane of the {10-11} plane and the {11-22} plane serving as a crystal growth plane except for the side surface of the crystal, when a thick GaN crystal is grown by adjusting the concentrations of impurities added to the GaN crystal (by the above-described accidental addition and deliberate addition described below) such as carbon, silicon, and oxygen, a GaN crystal and a GaN-crystal free-standing substrate that cause less yellow-light emission and have electrical conductivity can be provided.

An impurity intentionally added (deliberately added) to a GaN crystal is preferably silicon because silicon is less likely to cause yellow-light emission and has a low resistivity. A process of adding silicon to a GaN crystal is not particularly limited; and, as a doping gas, a silicon-containing gas such as $SiF_4$ (silicontetrafluoride) gas, $SiH_4$ (silane) gas, $Si_{2H6}$ (disilane) gas, $SiH_3Cl$ (monochlorosilane) gas, $SiH_2Cl_2$ (dichlorosilane) gas, $SiHCl_3$ (trichlorosilane) gas, or $SiCl_4$ (silicon tetrachloride) gas is preferably used. Of these, in particular, $SiF_4$ gas is preferably used. Compared with other silicon-containing gases, $SiF_4$ gas is less likely to be decomposed at a high temperature of 900° C. or more and 1150° C. or less, which allows for efficient addition to a GaN crystal.

Hereinafter, a method for growing by HVPE a GaN crystal to which, as a dopant (hereafter, means an impurity intentionally added (deliberately added)), for example, silicon is added will be described. A HVPE apparatus includes a first-source-gas cylinder, a doping-gas cylinder, a second-source-gas cylinder, a first-gas introduction pipe, a doping-gas introduction pipe, a second-gas introduction pipe, a source boat, a susceptor, a heater, a reaction tube, an exhaust pipe, and an exhaust-gas treatment device. The HVPE apparatus may have a horizontal reaction tube or a vertical reaction tube.

The reaction tube is a vessel within which a base substrate is supported and a GaN crystal is grown on the base substrate. The reaction tube may be, for example, a quartz reaction tube. A liner tube is preferably disposed within the reaction tube. Raw materials containing the elements constituting a GaN crystal to be gown are supplied to the first-source-gas cylinder, the second-source-gas cylinder, and the source boat. The doping-gas cylinder is filled with a gas containing silicon serving as a dopant, for example, $SiF_4$ gas. The first-gas introduction pipe, the doping-gas introduction pipe, and the second-gas introduction pipe are attached to the reaction tube to respectively introduce the first source gas, the doping gas, and the second source gas from the outside into the reaction tube. The source boat contains and holds a metal raw material of the GaN crystal, for example, metal Ga, and is disposed within the second-gas introduction pipe. The susceptor supports the base substrate.

The heater is disposed outside the reaction tube and has a capability of heating the entirety of the interior of the reaction tube to, for example, a temperature of 700° C. or more and 1500° C. or less. The reaction tube is equipped with the exhaust pipe to discharge gases having reacted to the outside of the reaction tube. The exhaust-gas treatment device is configured to make gases that have reacted and are discharged from the exhaust pipe be harmless to reduce load on the environment.

Next, the first-source-gas cylinder filled with $NH_3$ (ammonia) gas serving as the first source gas and the second-source-gas cylinder filled with HCl (hydrogen chloride) gas serving as the second source gas are provided. Metal Ga is supplied to the source boat. The doping-gas cylinder filled with $SiF_4$ gas is provided.

After that, the source boat is heated. The HCl gas (second source gas) supplied through the second-gas introduction pipe is allowed to react with metal Ga in the source boat to produce GaCl gas (gallium chloride) gas (reaction gas). The $NH_3$ gas (first source gas) supplied through the first-gas introduction pipe, the doping gas, and the reaction gas are made to flow (supplied) to hit a surface of the base substrate to thereby allow the reaction to occur. At this time, a carrier gas for carrying these gases to the base substrate may be used. The carrier gas may be an inert gas such as $N_2$ (nitrogen) gas, $H_2$ (hydrogen) gas, or Ar (argon) gas.

In HVPE, the interior of the reaction tube is heated with the heater to a temperature at which a GaN crystal is grown at an appropriate rate. The temperature at which a GaN crystal is grown is preferably 900° C. or more and 1150° C. or less, more preferably 1000° C. or more and 1100° C. or less.

When a GaN crystal having a thickness of 1 mm or more, preferably 3 mm or more, more preferably 5 mm or more, is grown under the above-described conditions on a base substrate, the GaN crystal is grown with the (0001) plane serving as a crystal growth plane and at least one plane (facet) of the {10-11} plane and the {11-22} plane serving as a crystal growth plane, except for the side surface of the GaN crystal; and the resultant GaN crystal also has, as the crystal growth planes except for the side surface of the crystal, the (0001) plane and at least one plane (facet) of the {10-11} plane and the {11-22} plane. The reason why the crystal growth planes of a GaN crystal except for the side surface of the crystal are discussed is that there may be a case where the crystal side surface serves as a crystal growth plane and, in such a case, facets are generally formed on the crystal side surface; and the facets on the crystal side surface are intended to be excluded. In such a GaN crystal, a large number of pits constituted by the facets are formed in the crystal growth planes. The plane orientations of the faces (that is, the facets) of the pits are mainly {10-11} and {11-22}. Although the depth of such a pit varies depending on crystal growth conditions and crystal growth thickness, in view of slicing a large number of GaN substrates from a GaN crystal, the depth is preferably equal to or less than the half of the crystal growth thickness. Although the area percentage of the area of portions obtained by projecting the facet-growth crystal region forming pits onto the main surface with respect to the total area of the main surface varies depending on growth conditions and film growth thickness, the area percentage is in the range of 0.1% or more and 99% or less.

The partial pressure of the silicon-containing gas ($SiF_4$ gas) during the growth of a GaN crystal is preferably $2.0 \times 10^{-7}$ atm or more and $1.0 \times 10^{-5}$ atm or less. When the partial pressure of the silicon-containing gas ($SiF_4$ gas) is $2.0 \times 10^{-7}$ atm or more, Si serving as an n-type dopant is sufficiently incorporated into the GaN crystal. When the partial pressure of the $SiF_4$ gas is $1.0 \times 10^{-5}$ atm or less, generation of $Si_xN_y$ (silicon nitride) compounds can be suppressed and hence controllability of doping with silicon can be enhanced. In consideration of the concentration of silicon with which a GaN crystal is doped, the partial pressure of the Si-containing gas ($SiF_4$ gas) is $1.0 \times 10^{-5}$ atm or less.

In the growth of a GaN crystal, silicon tends to be incorporated into the (0001)-plane-growth crystal region (first crystal region) grown with the (0001) plane serving as a crystal growth plane; and oxygen tends to be incorporated into the facet-growth crystal region (second crystal region) grown with at least one plane (facet) of the {10-11} plane and the {11-22} plane serving as a crystal growth plane.

Accordingly, as described above, by making the (0001)-plane-growth crystal region (first crystal region) and the facet-growth crystal region (second crystal region) be present during the growth of a GaN crystal and by suppressing addition of carbon and oxygen and adjusting addition of silicon to a GaN crystal being grown, a GaN crystal can be grown in which the (0001)-plane-growth crystal region (first crystal region) has a carbon concentration of $5 \times 10^{16}$ atoms/cm³ or less, a silicon concentration of $5 \times 10^{17}$ atoms/cm³ or more and $2 \times 10^{18}$ atoms/cm³ or less, and an oxygen concentration of $1 \times 10^{17}$ atoms/cm³ or less; and the facet-growth crystal region (second crystal region) has a carbon concentration of $3 \times 10^{16}$ atoms/cm³ or less, a silicon concentration of $5 \times 10^{17}$ atoms/cm³ or less, and an oxygen concentration of $5 \times 10^{17}$ atoms/cm³ or more and $5 \times 10^{18}$ atoms/cm³ or less. Preferably, a GaN crystal can be grown in which the (0001)-plane-growth crystal region (first crystal region) has a carbon concentration of $3 \times 10^{16}$ atoms/cm³ or less, a silicon concentration of $5 \times 10^{17}$ atoms/cm³ or more and $1 \times 10^{18}$ atoms/cm³ or less, and an oxygen concentration of $1 \times 10^{17}$ atoms/cm³ or less; and the facet-growth crystal region (second crystal region) has a carbon concentration of $2 \times 10^{16}$ atoms/cm³ or less, a silicon concentration of $5 \times 10^{17}$ atoms/cm³ or less, and an oxygen concentration of $5 \times 10^{17}$ atoms/cm³ or more and $2 \times 10^{18}$ atoms/cm³ or less.

In the substep of growing a GaN crystal, by adjusting the concentrations of carbon, silicon, and oxygen added to the (0001)-plane-growth crystal region (first crystal region) and the facet-growth crystal region (second crystal region) in the above-described manner, a GaN crystal can be grown that preferably has, over the entire surface thereof, a resistivity of 0.05 Ωcm or less, more preferably 0.02 Ωcm or less.

In the substep of growing a GaN crystal, a GaN crystal can be grown in the above-described manner in which the average density of dislocations extending through the main surfaces of the GaN crystal (hereafter, referred to as an average dislocation density) is preferably $3 \times 10^6$ cm$^2$ or less, more preferably $1 \times 10^6$ cm$^{-2}$ or less. In view of the current techniques for producing a GaN crystal, it is difficult to achieve an average dislocation density of less than $1 \times 10^4$ cm$^{-2}$ at present. Accordingly, the average dislocation density becomes about $1 \times 10^4$ cm$^{-2}$ or more.

[Step of Forming GaN-Crystal Free-Standing Substrate]

Although the step of forming a GaN-crystal free-standing substrate in a method for producing a GaN-crystal free-standing substrate according to the second embodiment is not particularly limited, the step may include at least one of a substep of removing a base substrate, a step of removing the circumferential portion of a GaN crystal, a substep of slicing a GaN crystal, and a substep of treating a main surface of a sliced GaN crystal.

(Substep of Removing Base Substrate)

In the substep of removing a base substrate, the process of removing the base substrate is not particularly limited and the process may be performed by, for example, cutting the base substrate with an outer diameter blade, an inner diameter blade, a wire saw, laser, or the like; or by grinding the base substrate with a diamond-coated grinding wheel or the like.

(Substep of Removing Circumferential Portion of GaN Crystal)

In the substep of removing the circumferential portion of a GaN crystal, the process of removing the circumferential portion of the GaN crystal is not particularly limited and the process may be performed by, for example, grinding the circumferential portion with a diamond-coated grinding wheel or the like.

(Substep of Slicing GaN Crystal)

In the substep of slicing a GaN crystal, the process of slicing the GaN crystal is not particularly limited and the process may be performed by, for example, cutting the GaN crystal with an outer diameter blade, an inner diameter blade, a wire saw, laser, or the like. In the substep of slicing a GaN crystal, in view of enhancing the productivity, a plurality of GaN-crystal free-standing substrates are preferably formed. In view of forming a GaN-crystal free-standing substrate, a thickness at which a GaN crystal is sliced (that is, the thickness of a GaN-crystal free-standing substrate) is preferably 100 μm or more, more preferably 300 μm or more.

(Substep of Treating Main Surface of Sliced GaN Crystal)

In the substep of treating a main surface of a sliced GaN crystal (that is, a GaN-crystal free-standing substrate), the process of treating the main surface of the GaN-crystal free-standing substrate is not particularly limited and the process may be performed by, for example, polishing such as mechanical polishing or chemical mechanical polishing or etching such as wet etching or dry etching.

As a result of the step of forming a GaN-crystal free-standing substrate, a GaN-crystal free-standing substrate can be formed from the GaN crystal; in the substrate, the (0001)-plane-growth crystal region (first crystal region) has a carbon concentration of $5 \times 10^{16}$ atoms/cm$^3$ or less, a silicon concentration of $5 \times 10^{17}$ atoms/cm$^3$ or more and $2 \times 10^{18}$ atoms/cm$^3$ or less, and an oxygen concentration of $1 \times 10^{17}$ atoms/cm$^3$ or less; and the facet-growth crystal region (second crystal region) has a carbon concentration of $3 \times 10^{16}$ atoms/cm$^3$ or less, a silicon concentration of $5 \times 10^{17}$ atoms/cm$^3$ or less, and an oxygen concentration of $5 \times 10^{17}$ atoms/cm$^3$ or more and $5 \times 10^{18}$ atoms/cm$^3$ or less. Preferably, a GaN-crystal free-standing substrate can be formed in which the (0001)-plane-growth crystal region (first crystal region) has a carbon concentration of $3 \times 10^{16}$ atoms/cm$^3$ or less, a silicon concentration of $5 \times 10^{17}$ atoms/cm$^3$ or more and $1 \times 10^{18}$ atoms/cm$^3$ or less, and an oxygen concentration of $1 \times 10^{17}$ atoms/cm$^3$ or less; and the facet-growth crystal region (second crystal region) has a carbon concentration of $2 \times 10^{16}$ atoms/cm$^3$ or less, a silicon concentration of $5 \times 10^{17}$ atoms/cm$^3$ or less, and an oxygen concentration of $5 \times 10^{17}$ atoms/cm$^3$ or more and $2 \times 10^{18}$ atoms/cm$^3$ or less.

In a GaN-crystal free-standing substrate produced by a production method according to the second embodiment, the average density of dislocations extending through the main surfaces of the substrate (average dislocation density) is preferably $3 \times 10^6$ cm$^{-2}$ or less, more preferably $1 \times 10^6$ cm$^{-2}$ or less. The lower the average density of such dislocations, the more reliable the resultant light-emitting device becomes.

A GaN-crystal free-standing substrate produced by a production method according to the second embodiment preferably has flat main surfaces and the radius of curvature of a crystal plane that is the closest to the main surfaces is preferably 10 m or more, more preferably 20 m or more. The larger the radius of curvature of such a crystal plane, the more uniform the light-emitting wavelength becomes within the surface of the resultant light-emitting device.

In a GaN-crystal free-standing substrate produced by a production method according to the second embodiment, the peak intensity of yellow-light emission (light emission having a broad peak wavelength range including 550 nm and wavelengths around 550 nm) excited by light having a peak wavelength of 400 nm can be made low over the entire surface of the substrate.

EXAMPLES

Example 1

In EXAMPLE 1, by adjusting the concentrations of carbon, silicon, and oxygen incorporated into a crystal in HVPE in a manner described below, a GaN-crystal free-standing substrate was obtained that had electrical conductivity and caused weak yellow-light emission at room temperature in both crystal regions of the (0001)-plane-growth crystal region and the facet-growth crystal region (the {10-11}-plane-growth crystal region and the {11-22}-plane-growth crystal region).

1. Providing of Base Substrate

A GaN base substrate having a diameter of 60 mm and a thickness of 400 μm was provided. The main surfaces of the base substrate were flat. The crystal plane that was the closest to the main surfaces was determined by X-ray diffractometry and it was found to be a (0001) plane. The radius of curvature of the (0001) plane was measured by X-ray diffractometry and it was found to be 20 m. The average density of dislocations extending through the main surfaces of the base substrate (average dislocation density) was measured by a CL method and it was found to be $1 \times 10^6$ cm$^{-2}$.

2. Growth of GaN Crystal

A GaN crystal was subsequently grown on the base substrate by HVPE with SiF$_4$ gas serving as a doping gas.

The GaN crystal was grown with a HVPE apparatus. A liner tube composed of pBN was disposed within a quartz reaction tube. N$_2$ gas was introduced as a purge gas into the gap between the quartz reaction tube and the liner tube. The tip portions of gas introduction pipes for introducing gases to a surface of the base substrate were constituted by pBN tubes. A susceptor on which the base substrate was placed was formed of carbon and coated with pBN. The base substrate was placed on this susceptor. $NH_3$ gas serving as the first source gas, HCl gas serving as the second source gas, $SiF_4$ gas serving as the doping gas, and $H_2$ gas serving as a carrier gas and having a purity of 99.999 vol % or more were provided. The carrier gas was introduced into the reaction tube through a first-gas introduction pipe, a second-gas introduction pipe, and a doping-gas introduction pipe; and the temperature of a heater was increased to 1000° C. After that, metal Ga was supplied to a source boat and the source boat was heated to 750° C.

The HCl gas supplied through the second-gas introduction pipe was allowed to react with Ga in the source boat as represented by $Ga+HCl>GaCl+½H_2$ to produce GaCl gas serving as a reaction gas.

The NH.sub.3 gas serving as the first source gas and supplied through the first-gas introduction pipe and the GaCl gas were subsequently made to flow together with the carrier gas to hit a main surface of the base substrate on which the GaN crystal was to be grown. Thus, a reaction represented by $GaCl+NH_3>GaN+HCl+H_2$ was allowed to occur on the main surface.

The GaN crystal having a diameter of 60 mm and a thickness of 5 mm was grown in a crystal growth time of 20 hours. The crystal growth surface of the GaN crystal included the (0001) plane and facets of the {10-11} plane and the {11-22} plane, and had a large number of pits formed by the facets. The pits had a depth of 1 to 1.5 mm. The area percentage of the area of portions obtained by projecting the facet-growth crystal region forming pits onto the main surface with respect to the total area of the main surface was about 80%.

3. Formation of GaN Substrates

The resultant GaN crystal was subsequently sliced with a slicer in a direction parallel to the base substrate.

The circumferential portions of the GaN-crystal free-standing substrates obtained by the slicing were subsequently removed. The GaN-crystal free-standing substrates obtained by the slicing and the subsequent removal of the circumferential portions were then subjected to chemical mechanical polishing (CMP) to remove the work-affected layers of the substrates. As a result, five GaN-crystal free-standing substrates having a diameter of 2 inches (50.8 mm) and a thickness of 400 μm were obtained from the GaN crystal.

4. Measurement of Physical Properties of GaN Substrate

Among the thus-obtained five GaN-crystal free-standing substrates, in the third GaN substrate from the base substrate, the concentrations of carbon, silicon, and oxygen in the (0001)-growth crystal region and the facet ({10-11} plane and {11-22} plane)-growth crystal region were measured by SIMS. Herein, the (0001)-plane-growth crystal region and the facet-growth crystal region were identified by observation with a fluorescent microscope. In addition, an emission spectrum due to excitation by light having a peak wavelength of 400 nm at room temperature (25° C.) was measured and the peak intensities of yellow-light emission were determined. The thus-obtained peak intensities of yellow-light emission were represented as relative intensities with respect to the intensity of yellow-light emission in the facet-growth crystal region of a GaN-crystal free-standing substrate obtained in COMPARATIVE EXAMPLE 2 described below.

The average density of dislocations extending through the main surfaces of the GaN-crystal free-standing substrate (average dislocation density) was $1\times10^6\,cm^{-2}$, which was as low as that of the base substrate. The radius of curvature of the (0001) plane of the GaN-crystal free-standing substrate was measured by X-ray diffractometry and it was found to be 20 m, which was as large as that of the base substrate. No cracking occurred in the GaN-crystal free-standing substrate. The resistivity of the GaN-crystal free-standing substrate was determined by Hall measurement and it was found to be 0.015 to 0.030 Ωcm in all the regions. The results are summarized in Table.

| | | | Example 1 | Comparative Example 1 | Comparative Example 2 |
|---|---|---|---|---|---|
| HVPE apparatus | Liner tube | | Composed of pBN | None | Composed of Carbon |
| | Nozzle of gas introduction pipes | | Composed of pBN | None | Composed of Carbon |
| | Susceptor | | Composed of carbon and coated with pBN | Composed of Carbon | Composed of Carbon |
| GaN-crystal free-standing substrate | Carbon concentration (atoms/cm³) | (0001)-plane-growth crystal region | $1.3 \times 10^{16}$ | $3.7 \times 10^{16}$ | $7.2 \times 10^{16}$ |
| | | facet-growth crystal region | $1.1 \times 10^{16}$ | $1.2 \times 10^{16}$ | $1.4 \times 10^{16}$ |
| | Silicon concentration (atoms/cm³) | (0001)-plane-growth crystal region | $1.0 \times 10^{18}$ | $1.4 \times 10^{18}$ | $1.2 \times 10^{18}$ |
| | | facet-growth crystal region | $2.2 \times 10^{16}$ | $3.1 \times 10^{16}$ | $1.8 \times 10^{16}$ |
| | Oxygen concentration (atoms/cm³) | (0001)-plane-growth crystal region | $1.8 \times 10^{16}$ | $1.2 \times 10^{17}$ | $1.9 \times 10^{16}$ |
| | | facet-growth crystal region | $1.1 \times 10^{18}$ | $6.2 \times 10^{18}$ | $3.1 \times 10^{18}$ |
| | Peak intensity of yellow-light emissions (relative intensity) | (0001)-plane-growth crystal region | 0.13 | 0.33 | 1.00 |
| | | facet-growth crystal region | 0.08 | 0.67 | 0.29 |

Referring to Table, by appropriately adjusting the concentrations of carbon, silicon, and oxygen in HVPE, a GaN-crystal free-standing substrate having low relative intensities of peak intensities of yellow-light emission in both of the (0001)-plane-growth crystal region and the facet-growth crystal region (that is, the entire surface) was obtained. In the facet-growth crystal region, the concentrations of the impurities and the intensities of yellow-light emission were substantially the same between the {10-11}-plane-growth crystal region and the {11-22}-plane-growth crystal region.

COMPARATIVE EXAMPLE 1

In contrast to EXAMPLE above, GaN-crystal free-standing substrates were produced as in EXAMPLE 1 except that the liner tube and the nozzles of gas introduction pipes were not disposed and the susceptor was formed of carbon. The thickness and pit-generation state of the resultant GaN crystal and the dislocation density and radius of curvature of such a GaN-crystal free-standing substrate were similar to those in EXAMPLE 1.

Referring to Table, compared with EXAMPLE 1, the relative intensities of the peak intensities of yellow-light emission of the GaN-crystal free-standing substrate were high in COMPARATIVE EXAMPLE 1. In particular, the relative intensity of the peak intensity of yellow-light emission in the facet-growth crystal region of the GaN-crystal free-standing substrate was very high. In the facet-growth crystal region, as in EXAMPLE 1, the concentrations of the impurities and the intensities of yellow-light emission were substantially the same between the {10-11}-plane-growth crystal region and the {11-22}-plane-growth crystal region.

COMPARATIVE EXAMPLE 2

In contrast to EXAMPLE 1 above, GaN-crystal free-standing substrates were produced as in EXAMPLE 1 except that a liner tube composed of carbon and carbon nozzles of gas introduction pipes were disposed and the susceptor was formed of carbon. The thickness and pit-generation state of the resultant GaN crystal and the dislocation density and radius of curvature of such a GaN-crystal free-standing substrate were similar to those in EXAMPLE 1.

Referring to Table, compared with EXAMPLE 1, the relative intensities of the peak intensities of yellow-light emission of the GaN-crystal free-standing substrate were high in COMPARATIVE EXAMPLE 2. In particular, the relative intensity of the peak intensity of yellow-light emission in the (0001)-plane-growth crystal region of the GaN-crystal free-standing substrate was very high. In the facet-growth crystal region, as in EXAMPLE 1, the concentrations of the impurities and the intensities of yellow-light emission were substantially the same between the {10-11}-plane-growth crystal region and the {11-22}-plane-growth crystal region.

Embodiments and Example disclosed herein are given by way of illustration in all the respects, and not by way of limitation. The scope of the present invention is indicated not by the above descriptions but by the Claims and is intended to embrace all the modifications within the meaning and range of equivalency of the Claims.

What is claimed:

1. A GaN substrate causing yellow-light emission, comprising:
    a first crystal region having a first intensity of yellow-light emission; and
    a plurality of second crystal regions having a second intensity of yellow-light emission,
    wherein the first intensity is not equal to the second intensity, and the first crystal region and the plurality of second crystal regions being arranged in a same physical plane, and
    wherein a crystal growth plane of a surface in the GaN substrate of the first crystal region is not equal to a crystal growth plane of a surface in the GaN substrate of the plurality of second crystal regions.

2. The GaN substrate according to claim 1, wherein
    the first crystal region has a carbon concentration of $3 \times 10^{16}$ atoms/cm$^3$ or less, a silicon concentration of $5 \times 10^{17}$ atoms/cm$^3$ or more and $1 \times 10^{18}$ atoms/cm$^3$ or less, and an oxygen concentration of $1 \times 10^{17}$ atoms/cm$^3$ or less; and
    the second crystal region has a carbon concentration of $2 \times 10^{16}$ atoms/cm$^3$ or less, a silicon concentration of $5 \times 10^{17}$ atoms/cm$^3$ or less, and an oxygen concentration of $5 \times 10^{17}$ atoms/cm$^3$ or more and $2 \times 10^{18}$ atoms/cm$^3$ or less.

3. The GaN substrate according to claim 1, wherein
    the first crystal region has a carbon concentration of $5 \times 10^{16}$ atoms/cm$^3$ or less, a silicon concentration of $5 \times 10^{17}$ atoms/cm$^3$ or more and $2 \times 10^{18}$ atoms/cm$^3$ or less, and an oxygen concentration of $1 \times 10^{17}$ atoms/cm$^3$ or less; and
    the second crystal region has a carbon concentration of $3 \times 10^{16}$ atoms/cm$^3$ or less, a silicon concentration of $5 \times 10^{17}$ atoms/cm$^3$ or less, and an oxygen concentration of $5 \times 10^{17}$ atoms/cm$^3$ or more and $5 \times 10^{18}$ atoms/cm$^3$ or less.

4. The GaN substrate according to claim 1, wherein a crystal growth plane of a surface in the GaN substrate of the first crystal region is a (0001) plane, and a crystal growth plane of a surface in the GaN substrate of the plurality of second crystal regions is at least one of a {10-11} plane and a {11-22} plane.

* * * * *